United States Patent
Ke et al.

(10) Patent No.: US 9,659,804 B2
(45) Date of Patent: May 23, 2017

(54) ORIENTATING AND INSTALLING JIG

(71) Applicant: WISTRON CORP., New Taipei (TW)

(72) Inventors: Xiao-Hua Ke, New Taipei (TW); Wan-Rong Zhu, New Taipei (TW)

(73) Assignee: WISTRON CORP., New Taipei (TW)

( * ) Notice: Subject to any disclaimer, the term of this patent is extended or adjusted under 35 U.S.C. 154(b) by 217 days.

(21) Appl. No.: 14/269,141

(22) Filed: May 3, 2014

(65) Prior Publication Data

US 2015/0052722 A1    Feb. 26, 2015

(30) Foreign Application Priority Data

Aug. 20, 2013 (CN) .......................... 2013 1 0364921

(51) Int. Cl.
- H01L 21/683 (2006.01)
- H05K 3/30 (2006.01)
- H05K 3/00 (2006.01)

(52) U.S. Cl.
CPC ......... *H01L 21/6835* (2013.01); *H05K 3/301* (2013.01); *H05K 3/0061* (2013.01); *H05K 2201/10393* (2013.01); *H05K 2203/0182* (2013.01); *Y10T 29/53978* (2015.01)

(58) Field of Classification Search
None
See application file for complete search history.

(56) References Cited

U.S. PATENT DOCUMENTS

| | | | | |
|---|---|---|---|---|
| 7,651,308 B2* | 1/2010 | Ruth | .................. | G01R 31/2893 257/726 |
| 2004/0221782 A1* | 11/2004 | Nishikawa | ............. | D05B 29/02 112/235 |
| 2006/0156540 A1* | 7/2006 | Cromwell | .............. | H05K 3/303 29/739 |
| 2013/0055562 A1 | 3/2013 | Lin | | |

FOREIGN PATENT DOCUMENTS

TW    M308446    3/2007

\* cited by examiner

Primary Examiner — Joseph J Hail
Assistant Examiner — Brian Keller
(74) Attorney, Agent, or Firm — Li & Cai Intellectual Property (USA) Office

(57) ABSTRACT

An orientating and installing jig for orientating a heat-dissipating unit (or a workpiece) to fix on a heat-generating device (or a target device) above a circuit board (or a supporting baseplate), which includes a carrying board formed with at least one assembling opening, a plurality of fixing posts and a pair of arrest-orientating modules oppositely arranged at two sides of the assembling opening. The assembling opening is shaped correspondingly to the shape of the heat-dissipating unit. The fixing posts are disposed at a bottom surface of the carrying board for fixing the carrying board above the circuit board. Each arrest-orientating module includes an arresting barrier. The arresting barrier is rotatably disposed at a suspending position of suspending the workpiece on the carrying board, and a releasing position of allowing the workpiece to pass through the assembling opening, so that the workpiece is put on the target device.

14 Claims, 9 Drawing Sheets

ORIENTATING AND INSTALLING JIG

BACKGROUND OF THE INSTANT DISCLOSURE

1. Field of the Instant Disclosure

The instant disclosure relates to an orientating and installing jig for disposing a workpiece on a target device, more specifically, for example to orientate a heat-dissipating device accurately and certainly on a heat-generating element, such as a chip.

2. Description of Related Art

In order to release the heat produced by the heat-generating electronic elements, such as a central processing unit (CPU) or a chip, a heat-dissipating device is usually mounted on the heat-generating electronic element to achieve the object. Further, to make sure that the heat-dissipating device is well contacted with the heat-generating electronic element, a thermal paste is sprayed on the bottom surface of the heat-dissipating device for filling gaps and transferring heat therebetween.

Generally, a jig is used to guide the heat-dissipating device accurately on the heat-generating electronic element, and an external pressure is applied on the heat-dissipating device for dispreading the thermal paste uniformly between the heat-generating electronic element and the heat-dissipating device.

Conventionally, after the heat-dissipating device is manually disposed in the jig, then the heat-dissipating device is directly positioned on the heat-generating electronic element. If the assembly personnel ignores the step of pressing the heat-dissipating device, which would not be properly attached on the top of the heat-generating electronic element, worse thermal conduction will happen.

SUMMARY OF THE INSTANT DISCLOSURE

The object of the instant disclosure is to provide an orientating and installing jig for assuring a workpiece, such as a heat-dissipating device, that can be accurately positioned and assuredly attached on a target device, such as a heat-generating device, during assembly process.

In order to achieve the aforementioned objects, according to an embodiment of the instant disclosure, an orientating and installing jig for arranging a workpiece to attach with a target device on a supporting baseplate. The orientating and installing jig includes a carrying board and at least one arrest-orientating module. The carrying board is formed with at least one assembling opening. The assembling opening is shaped correspondingly to a shape of the target device. The carrying board is uplifted and fixed above the supporting baseplate. Each arrest-orientating module is disposed on the carrying board and partially extended into the assembling opening. Each arrest-orientating module has a arresting barrier, which is rotatably arranged at a suspending position of supporting the workpiece above the carrying board, and at a releasing position of allowing the workpiece passing through the assembling opening for being disposed on the heat-generating device.

Based on the above, the instant disclosure has at least the following advantages, that can guide the heat-dissipating unit (or called as a workpiece) to a normal position. It needs a step of exerting an external force during assembling process, and then the heat-dissipating unit can be disposed on the heat-generating device (or called as a target device). Therefore, it can make sure that the external force is pressed on the heat-dissipating unit to tightly against a top surface of the heat-generating device (such as a chip), and an accidental omitting of manual pressing operation could be avoided.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 7:
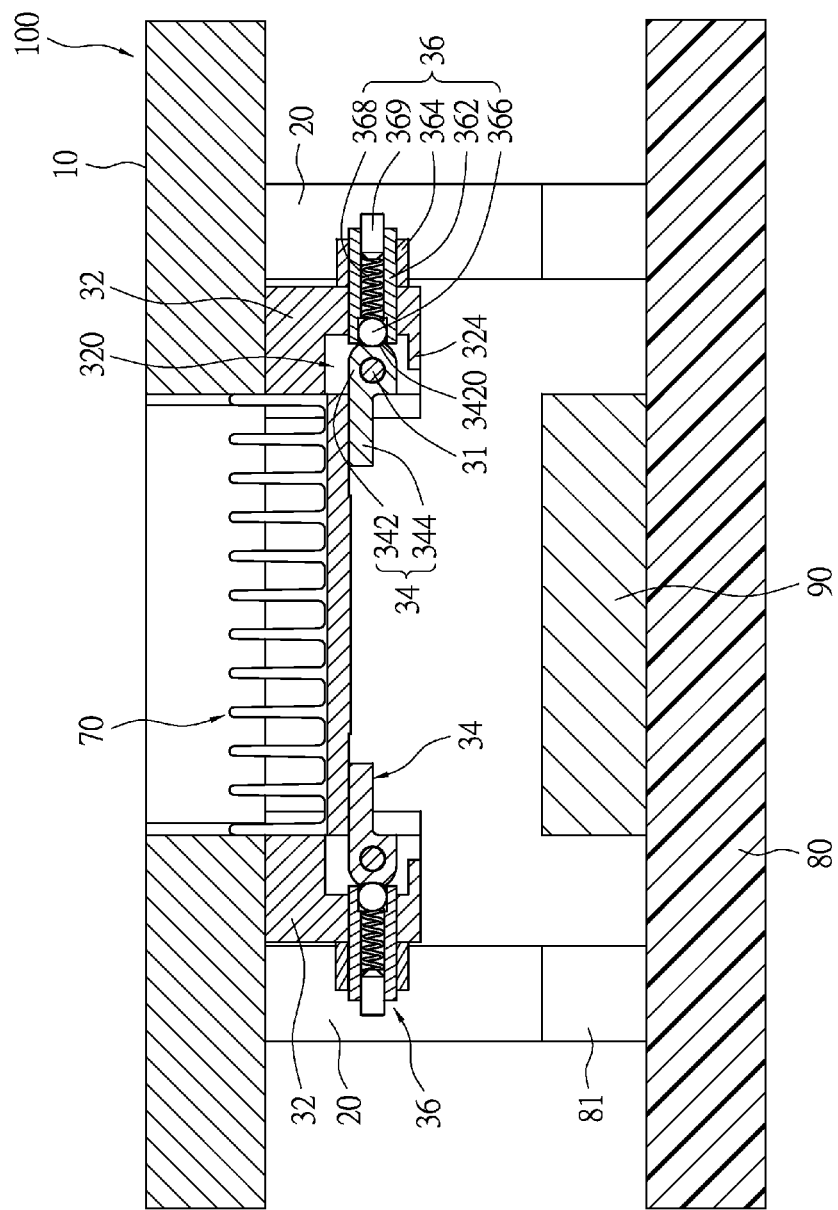
FIGS. 7 to 9 show perspective views of the orientating and installing jig that is mounted with a heat-dissipating unit thereon according to the instant disclosure.
Figure 9:
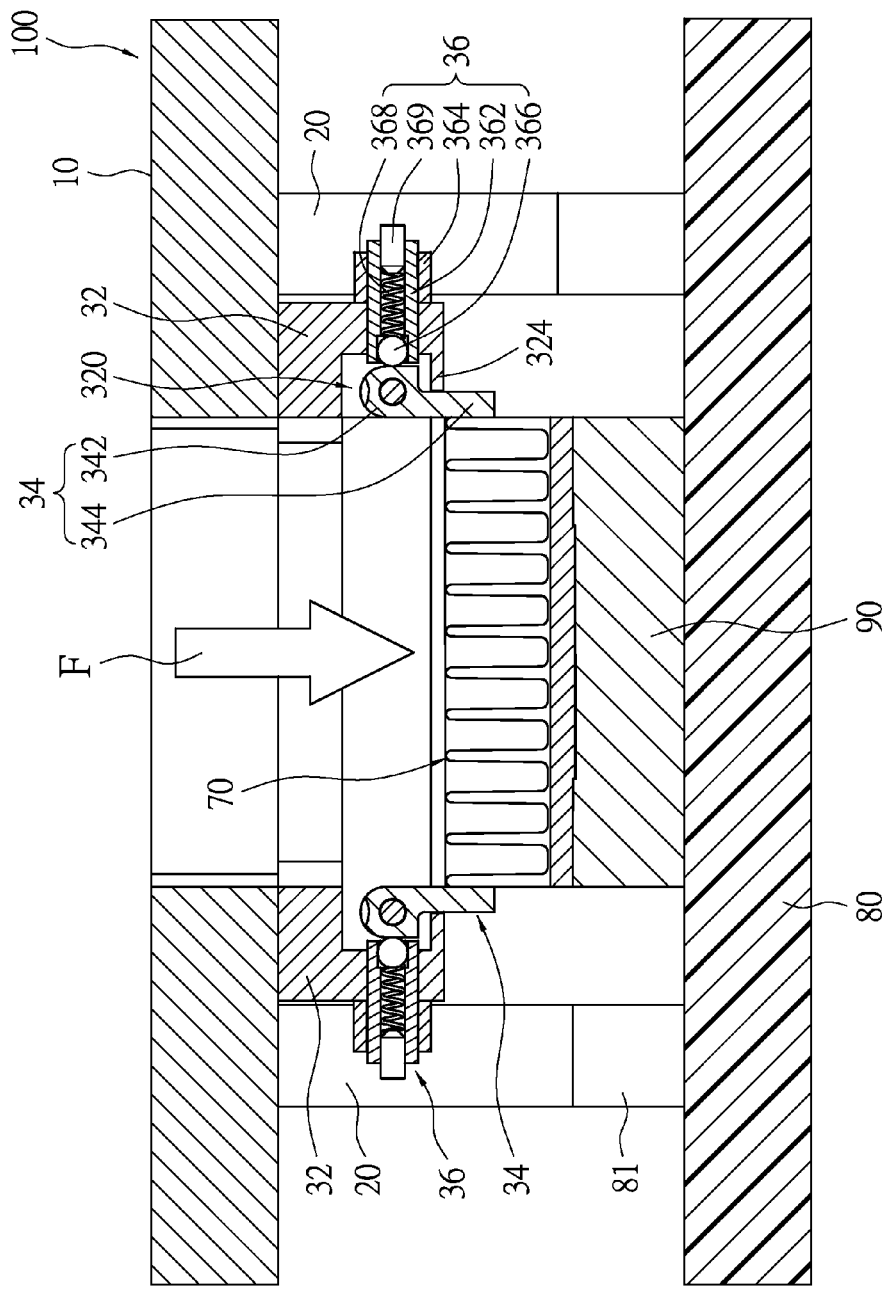

With reference to FIGS. 1-4, which are exploded view and assembled views of an orientating and installing jig according to the instant disclosure. The instant disclosure provides an orientating and installing jig 100 for assisting to arrange a heat-dissipating unit 70 (as shown in FIGS. 7 and 9) fixed on a heat-generating device 90a on a circuit board 80. The heat-generating device 90 could be a chip, but not limited thereto.

Figure 1:
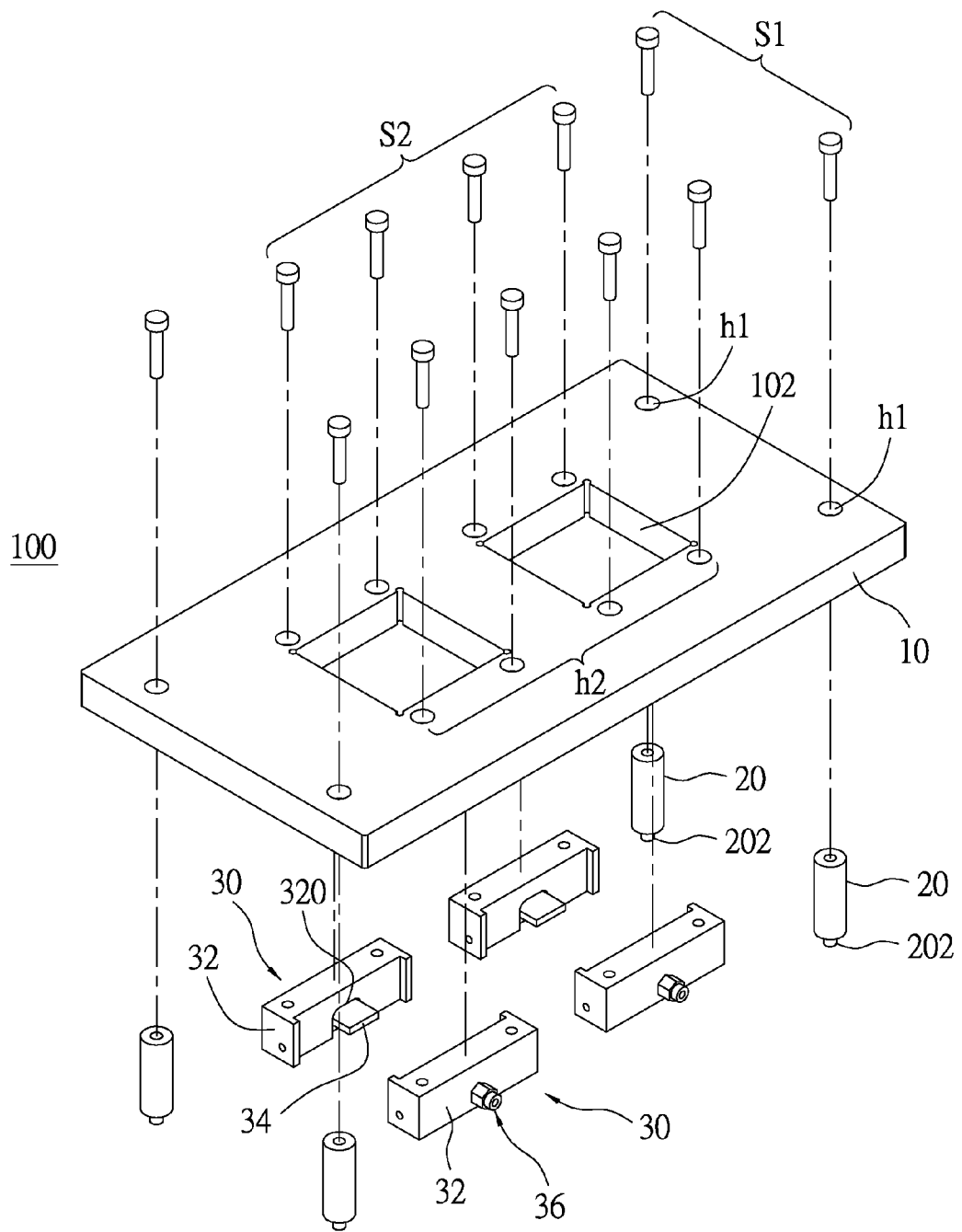
FIG. 1 shows a perspective exploded view of an orientating and installing jig according to the instant disclosure.
Figure 2:
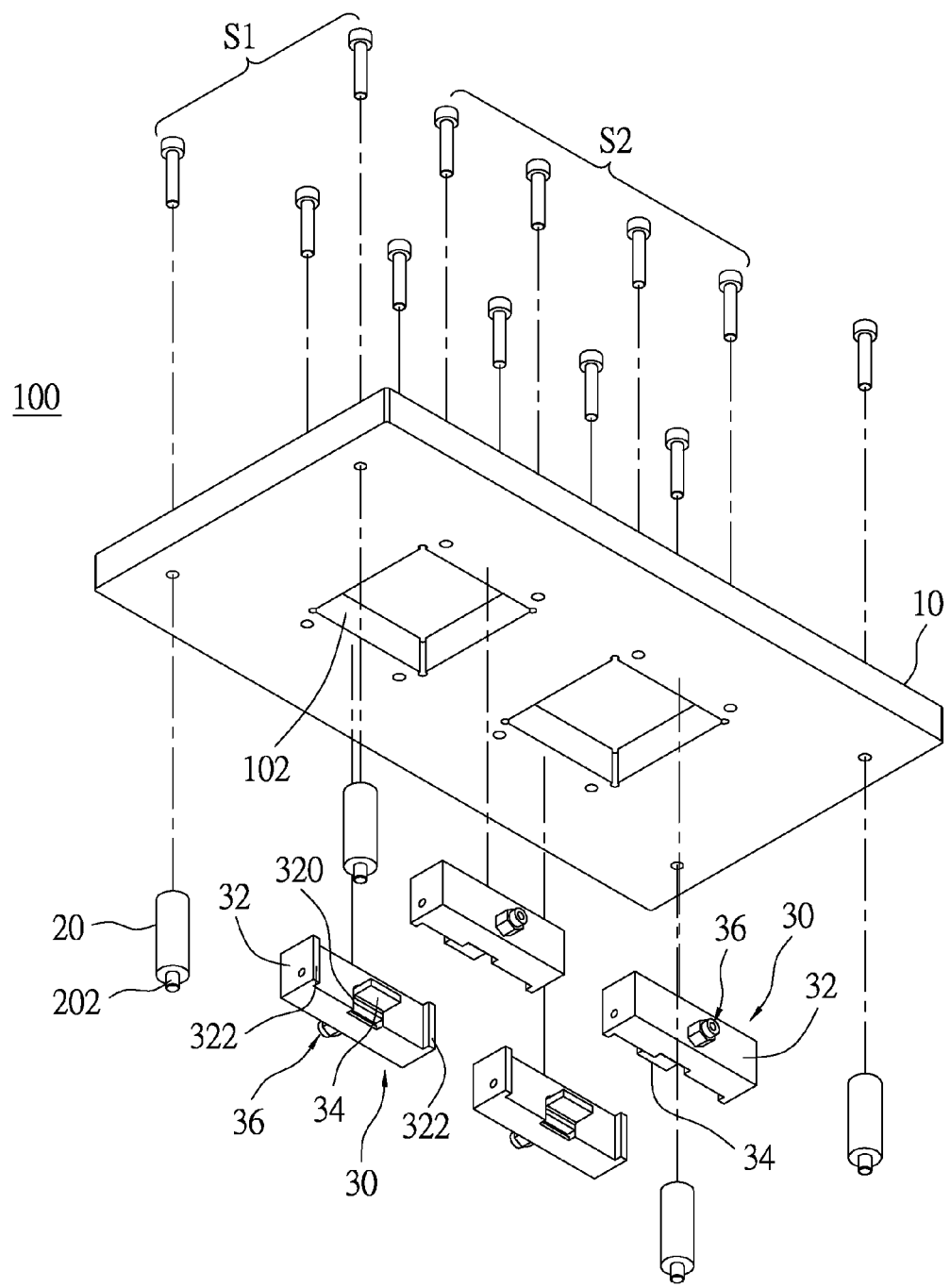
FIG. 2 shows another perspective exploded view of the orientating and installing jig according to the instant disclosure.

The orientating and installing jig 100 includes a carrying board 10 formed with at least one assembling opening 102, a plurality of fixing posts 20 and at least one arrest-orientating module 30 assembled with the carrying board 10. Each arrest-orientating module 30 has a part extending into the assembling opening 102. In this embodiment, there is one pair of arrest-orientating modules 30 which are oppositely disposed at two sides of the assembling opening 102. The carrying board 10 of this embodiment has two assembling openings 102, but the quantity is not limited thereto. The shape of the assembling opening 102 is substantially corresponded to that of the heat-dissipating unit 70, which is usually is rectangular. The fixing posts 20 are arranged on a bottom surface of the carrying board 10, so that the carrying board 10 can be uplifted and fixed above the circuit board 80. A plurality of screws S1 are used in this embodiment, which passes downward thread holes h1 of the carrying board 10 and screws the fixing posts 20 to a bottom surface of the carrying board 10. However, the fixing way of the fixing posts 20 is not limited thereto. For example, the fixing posts 20 can be formed with a screwing structure on a top surface thereof for being directly screwed to the carrying board 10. Besides, in this embodiment, each fixing post 20 has a fixing protrusion 202 protruded from a bottom end thereof (as shown in FIG. 1) so as to be fixed at the corresponding location portion of the circuit board 80, such as location hole or matched fixing post (as 81 shown in FIGS. 7-9).

Figure 4:
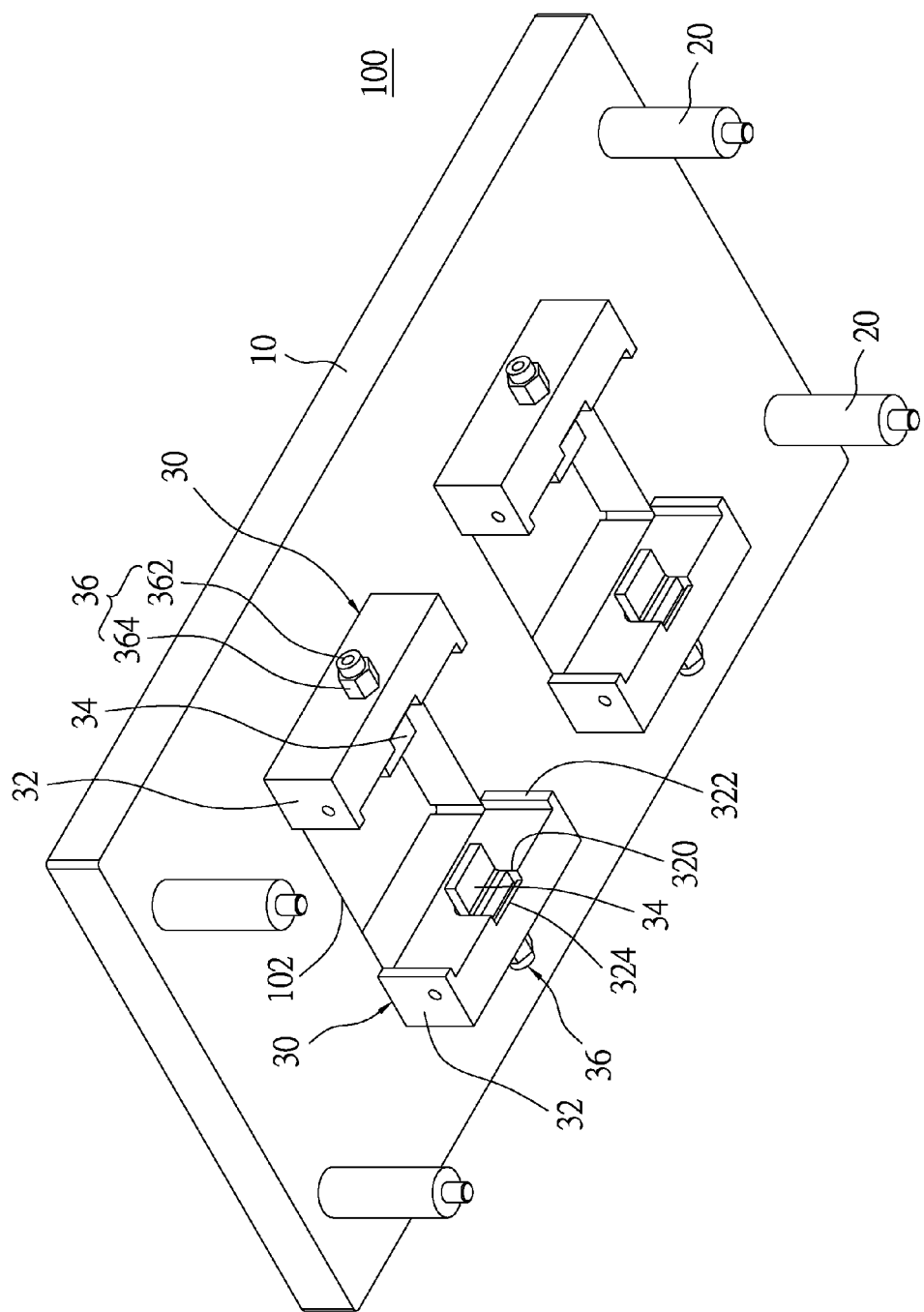
FIG. 4 shows another perspective assembled view of the orientating and installing jig according to the instant disclosure.
Figure 5:
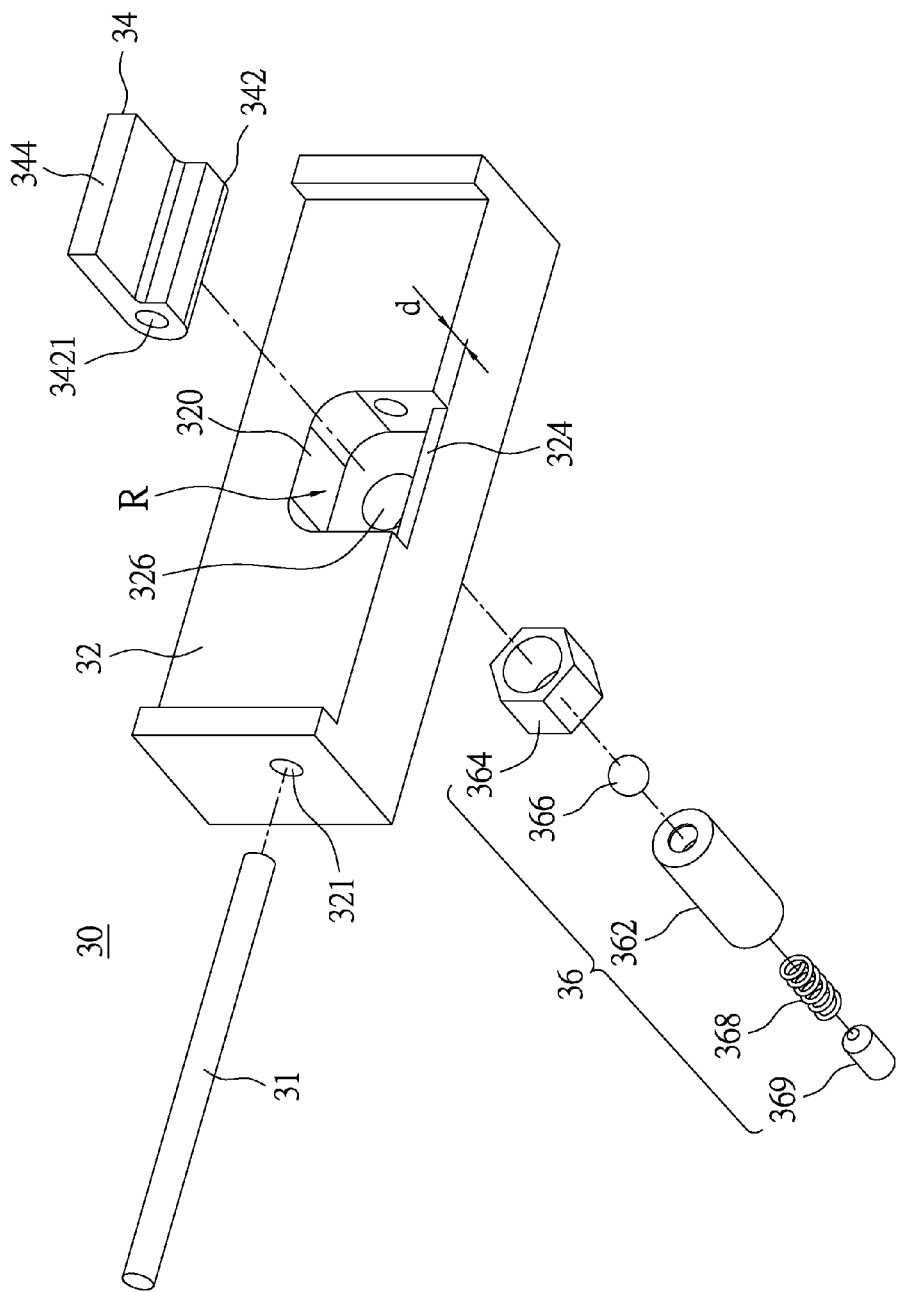
FIG. 5 shows a perspective exploded view of a arrest-orientating module according to the instant disclosure.
Figure 6:
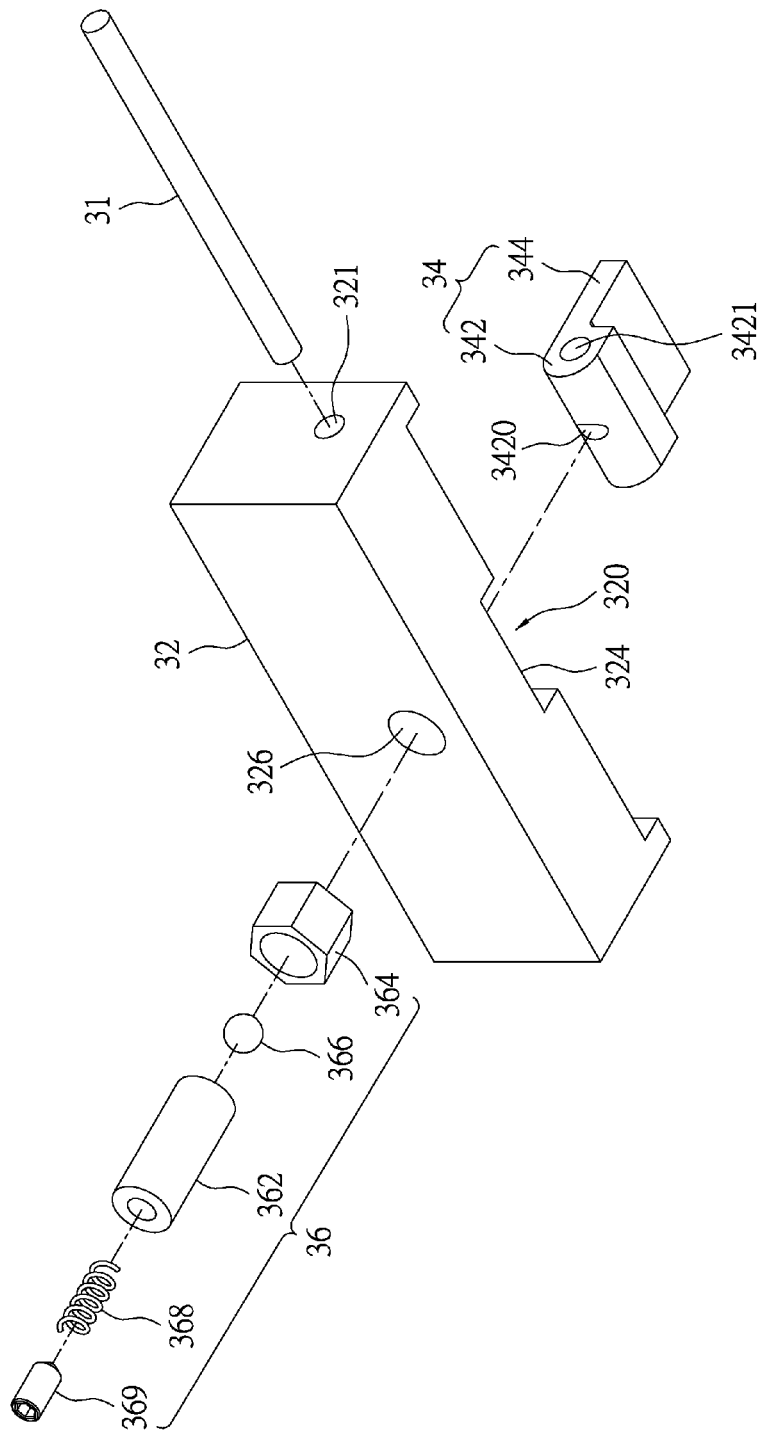
FIG. 6 shows another perspective exploded view of the arrest-orientating module according to the instant disclosure.

With reference to FIGS. 4 to 6, wherein FIGS. 5 to 6 show perspective exploded view of the arrest-orientating module. Each arrest-orientating module 30 includes an arresting barrier 34. By an external force, the arresting barrier 34 is rotatably arranged at a suspending position of supporting the heat-dissipating unit 70 (workpiece) above the carrying board 10, and at a releasing position of allowing the heat-dissipating unit 70 passing through the assembling opening 102 for being disposed on the heat-generating device 90. Concerning the suspending position, the arresting barrier 34 is substantially perpendicular to an assembling direction of the heat-dissipating unit 70, so as to temporarily stop the heat-dissipating unit 70. Concerning the releasing position, the arresting barrier 34 is rotated until parallel to the assembling direction of the heat-dissipating unit 70, so that the heat-dissipating unit 70 could be passed through the arrest-orientating module 30 and is disposed on a correct position.

In this embodiment, each arrest-orientating module 30 includes a hinge seat 32 which is connected with the carrying board 10 and proximate to the assembling opening 102. The arresting barrier 34 is rotatably mounted on the hinge seat 32. However, the instant disclosure is not limited thereto. It just needs the arresting barrier 34 is rotatable related to the carrying board 10. As shown in FIG. 1, a plurality of screws S2 passes through thread holes h2 of the carrying board 10, so that the hinge seat 32 is screwed to a bottom surface of the carrying board 10. But it is not limited thereto, for example, the hinge seat 32 can be formed integrally on the bottom surface of the carrying board 10.

Figure 3:
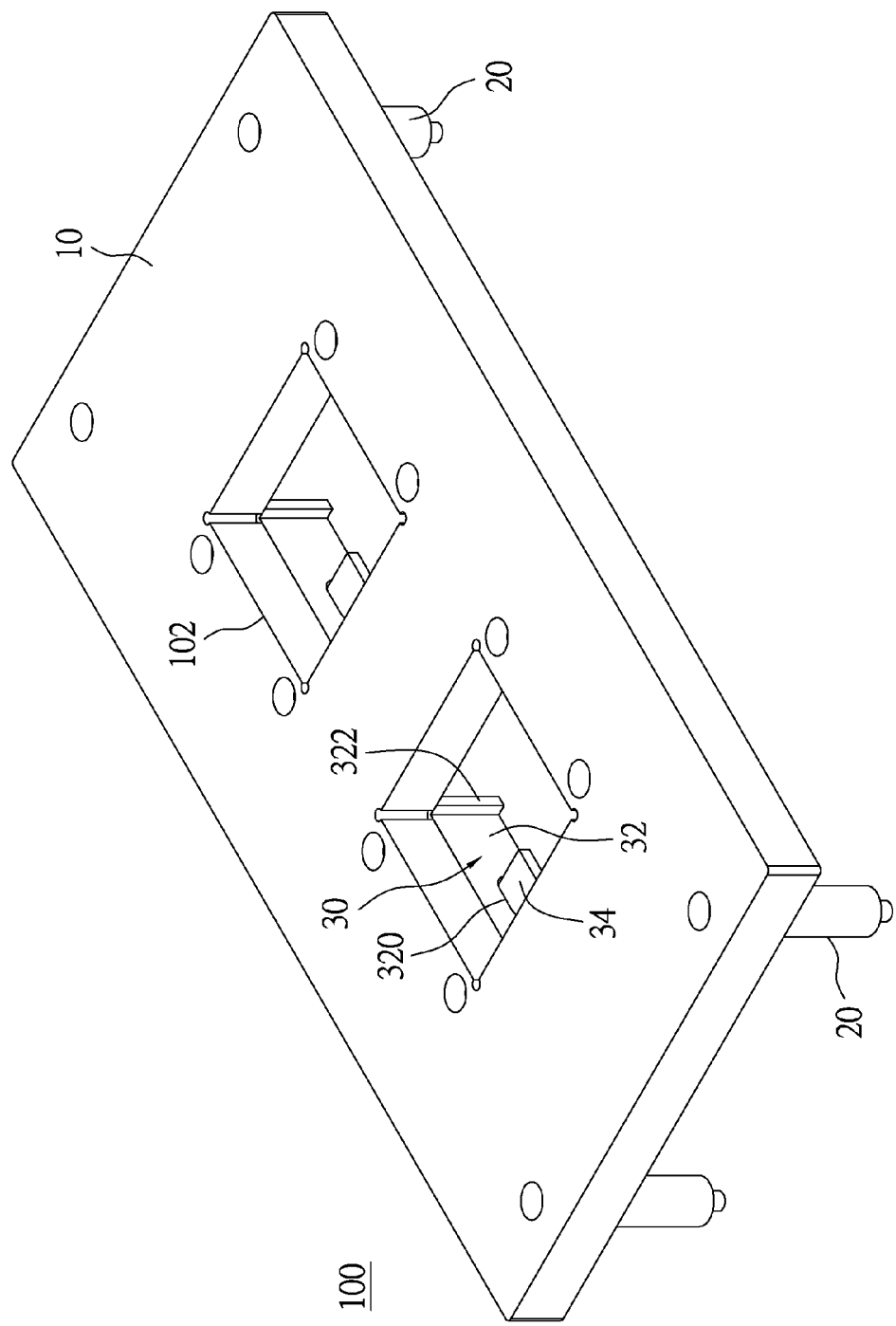
FIG. 3 shows a perspective assembled view of the orientating and installing jig according to the instant disclosure.

As shown in FIGS. 3 to 4, each hinge seat 32 has a pair of guiding portions 322 formed at two sides thereof. The distance between the pair of guiding portions 322 is substantially equal to the width of the heat-dissipating unit 70. In other aspect, the inner sides of the guiding portions 322 are aligned with the inner edges of the assembling opening 102, respectively. Therefore, the hinge seat 32 can follow the assembling opening 102 to guide the heat-dissipating unit 70 being located at correct position.

Refer to FIG. 5, for connecting the hinge seat 32 to the carrying board 10, the hinge seat 32 has a receiving compartment 320 formed concavely from a bottom surface thereof. The arresting barrier 34 is received in the receiving compartment 320. Each arrest-orientating module 30 further includes a bolt 31 which is transversely passing through the hinge seat 32, the receiving compartment 320 and the arresting barrier 34. Thus, the arresting barrier 34 is rotatably connected to the hinge seat 32. In this embodiment, the hinge seat 32 has a bolt-slot 321 formed through along a longitudinal direction thereof for receiving a bolt 31.

As shown in FIG. 5, to make the arresting barrier 34 accurately disposed on the releasing position, the hinge seat 32 has a restrict protrusion 324 protruded in the receiving compartment 320 and aligned to the bottom surface of the hinge seat 32. The restrict protrusion 324 and an inner surface of the receiving compartment 320 are formed with a rotation space R. A front end of the restrict protrusion 324 is concaved away from the inner surface of the hinge seat 32 with a predestinated distance d.

In detail, the arresting barrier 34 has a rotating part 342 and a blocking part 344 extended from the rotating part 342. The rotating part 342 is substantially shaped in a cylinder and arranged in the receiving compartment 320, also in the rotation space R. The rotating part 342 is formed with an axle hole 3421 for the bolt 31 passing therethrough. The blocking part 344 is plate-shaped and extended into the assembling opening 102. A thickness of the blocking part 344 is substantially equal to the predestinated distance d.

Refer to FIGS. 5 and 6, to fix the arresting barrier 34 at the suspending position, each arrest-orientating module 30 further includes a position-latch module 36 mounted with the hinge seat 32. The hinge seat 32 has a through hole 326 formed through from an outer side of the hinge seat 32 to the receiving compartment 320, that is communicated with the rotation space R. The direction of the through hole 326 is substantially perpendicular to the bolt-slot 321 of the hinge seat 32. The position-latch module 36 is installed from the outer side of the hinge seat 32 through the through hole 326 and extended into the receiving compartment 320. The position-latch module 36 is abutted against the rotating part 342 of the arresting barrier 34 to fix the arresting barrier 34 at corresponding positions.

In this embodiment, the position-latch module 36 has a cylinder element 362 fixed in the through hole 326, a wedge roller 366 received in the cylinder element 362, and a spring 368 received in the cylinder element 362 for elastically pushing the wedge roller 366. The wedge roller 366 is partially exposed outside one end of the cylinder element 362 for abutting against the rotating part 342 of the arresting barrier 34. An outer end of the rotating part 342 is formed with a roller groove 3420 (as shown in FIG. 6) corresponding to the wedge roller 366. The cylinder element 362 could be formed with thread on a circumference for screwing with the through hole 326 of the hinge seat 32. The cylinder element 362, the wedge roller 366, and the spring 368 could be deemed as a wave bead screw, which can be an available positioning bead screw with a hexagon slot formed at its outer end for tool.

Besides, the position-latch module 36 can has a remaining nut 364 for screwing the cylinder element 362 to the hinge seat 32. The remaining nut 364 is abutted against the outer surface of the hinge seat 32, so as to prevent the cylinder element 362 from loosening. In other aspect, this embodiment further has a adjusting screw 369 screwed to an rear end of the cylinder element 362 to adjust the elasticity of the spring 368. It therefor can adjust the force of the wedge roller 366 acted on the arresting barrier 34. An assembled cross-sectional view of the position-latch module 36 is shown as FIG. 7.

Figure 8:
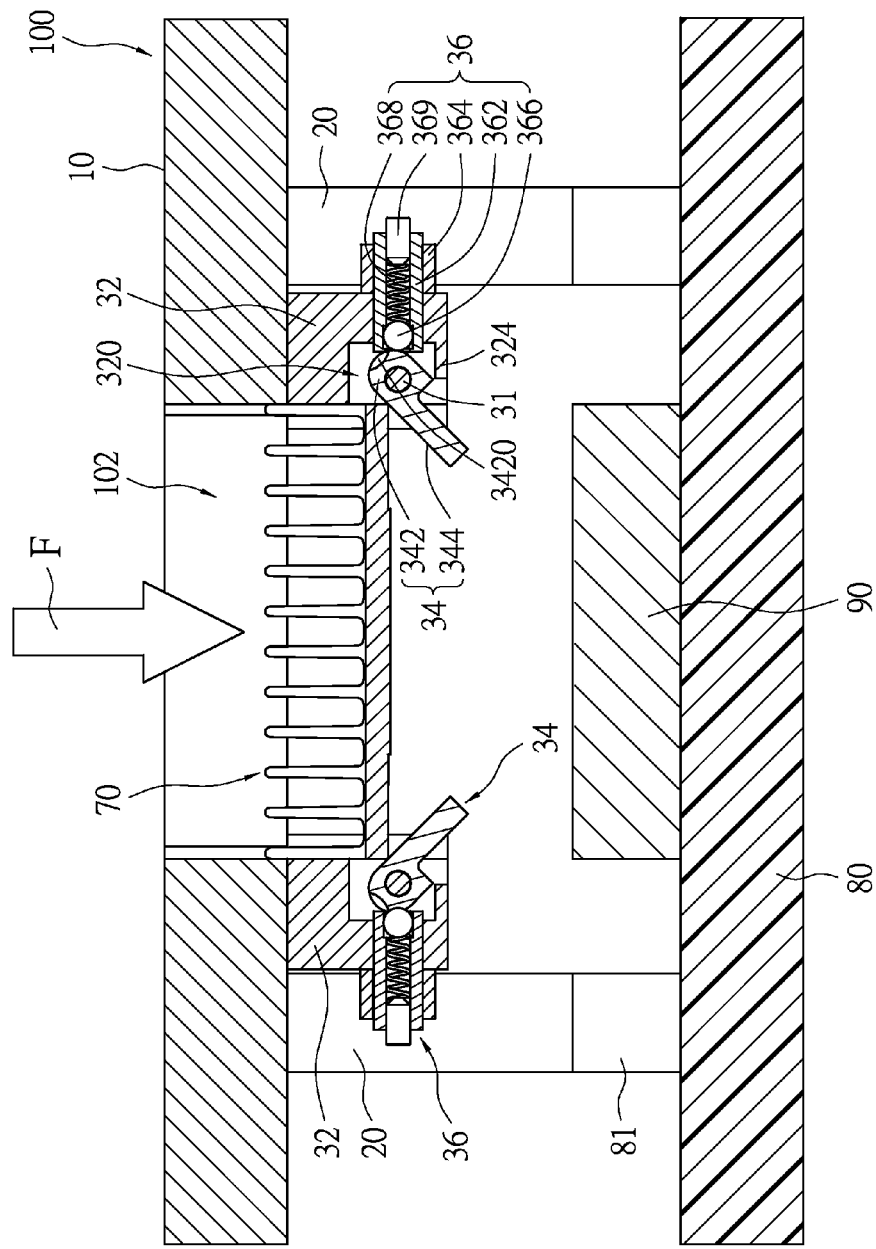

Refer to FIG. 7 to FIG. 9, which are perspective views of the orientating and installing jig of the instant disclosure guiding and orientating a heat-dissipating unit on a top surface of the heat-generating device 90, such as a chip. With reference to FIG. 7. First, the fixing posts 20 of the orientating and installing jig 100 are aligned and fixed to the location portion 81 of the circuit board 80, so that the assembling opening 102 is arranged above the corresponding heat-generating device 90. The arresting barrier 34 needs to be rotated to the suspending position, so that the direction of the blocking part 344 is positioned parallel to the carrying board 10. Also, it is perpendicular to an assembling direction of the heat-dissipating unit 70. Because the wedge roller 366 of the position-latch module 36 is abutted against the roller groove 3420 of the blocking part 344, the arresting barrier 34 can be keep at a horizontal condition. Then, the heat-dissipating unit 70 is disposed into the assembling opening 102 of the orientating and installing jig 10. A supplementary note, the abutting fore of the wedge roller 366 needs to be larger the weight of the heat-dissipating unit 70. Before this step, the processes of spraying thermal paste or glue were performed.

As shown in FIG. 8, an external force F is needed to pushed on the heat-dissipating unit 70. The external force F can be exerted by an assembling pressing-bar. The external force F overcomes the force of the wedge roller 366 against the arresting barrier 34, so that the blocking part 344 of the arresting barrier 34 moves downward. Then, the heat-dissipating unit 70 can move downward. When the heat-dissipating unit 70 is passing through the assembling opening 102, the guiding portions 322 of the hinge seat 32 follows the guiding process to guide the heat-dissipating unit 70 until onto the heat-generating device 90. Therefore, not only the carrying board 10 can guide the heat-dissipating unit 70 to a normal assembly position, but also the hinge seat 32 can guide the heat-dissipating unit 70 to the normal position on the heat-generating device 90.

With reference to FIG. 9. When the arresting barrier 34 is rotated to the releasing position, the blocking part 344 is completely at an erect condition and against the restrict protrusion 324 of the receiving compartment 320. The outer surface of the blocking part 344 is aligned to the inner surface of the hinge seat 32. The heat-dissipating unit 70 can smoothly move downward onto the top surface of the heat-generating device (or chip) 90. When the external force F pushes the heat-dissipating unit 70 onto the top surface of the heat-generating device (or chip) 90, it can be exerted continuously to make sure that the heat-dissipating unit 70 is attached to the heat-generating device (or chip) 90.

An additional remark, the fixing posts 20 of the instant disclosure uplifted the carrying board 10, so that a lower end of the hinge seat 32 is arranged at a distance from the circuit board 90 to form a buffer space therebetween. Thus, other elements on the circuit board 90 can be avoided from colliding. The arresting barrier 34 will not affect the other elements on the circuit board 90.

Therefore, the orientating and installing jig 100 of the instant disclosure can provides function of guiding the heat-dissipating unit 70 until a normal position. Besides, by the arrest-orientating module 30 co-operating with the external force, an assembling operator needs to a step of exerting the external force and then the heat-dissipating unit 70 can pass the arrest-orientating module 30 to be disposed on the heat-generating device 90. Thus, it can ensure an external force is exerted on the heat-dissipating unit to tightly against the top surface of the heat-generating device (or chip) 90, and an accidental omitting of manual pressing operation could be avoided. Comparing with a tradition jig, which only provides a locating function, if the operator ignores to exert an external force on the heat-dissipating unit and just put on the chip, the heat-dissipating unit will not be certainly attached with the chip.

Therefore, the instant disclosure can certainly provide the heat-dissipating unit a pressing action for assembly. If an external force is not exerted, the heat-dissipating unit could not leave the orientating and installing jig. It has the function of preventing the operator from wrongly assembling, or called anti-accident function. Besides, the instant disclosure also provides the function of protection and orientating during the heat-dissipating unit is pressing.

To emphasize an additional remark, the instant disclosure is not limited to put the heat-dissipating unit onto the heat-generating device. It can be applied to put downward a workpiece onto a predestinated position of a target device at a lower position. For example, to put a protecting cover onto the top surface of the target device needed protection. The target device could be put on a supporting baseplate in advance. The supporting baseplate has a function like a circuit board, or can be deemed as a lower protection cover. The assembling opening of the carrying board has a shape which is substantially matched with the shape of the workpiece. The carrying board is fixed above the supporting baseplate in a uplifted manner. The instant disclosure especially is suitable for the workpiece needed a pressing step with an external force, accurately positioning, compression attaching action and anti-accidental function, so as to be fixed on the target device.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An orientating and installing jig for orientating a workpiece and installing to a predetermined position of a target device, wherein the target device is disposed on a supporting baseplate, the orientating and installing jig comprising:

a carrying board, formed with an assembling opening, wherein the carrying board has a bottom surface and is uplifted and fixed above the supporting baseplate to form an observing space between the carrying board and the supporting baseplate; and at least one arrest-orientating module, mounted on the carrying board, each of the at least one arrest-orientating module having:

a hinge seat having a top side dismountably connected to the bottom surface of the carrying board and adjacent to the assembling opening, wherein the hinge seat is formed with a through hole;

an arresting barrier, rotatably mounted on the hinge seat under the bottom surface of the carrying board; and a position-latch module, having a cylinder element fixed in the through hole, a wedge roller received in the cylinder element and exposed outside one end of the cylinder element, an adjusting screw screwed to an rear end of the cylinder element, and a spring received in the cylinder element abutting the wedge roller and the adjusting screw;

wherein the arresting barrier includes a rotating part and a blocking part extended from the rotating part; wherein the rotating part has a roller groove on an end thereof opposite to a free end of the blocking part; wherein the rotating part is rotatable along an axle transversely passing through the hinge seat, wherein the blocking part is rotatably movable to a suspending position substantially parallel to the bottom surface of the carrying board to block the workpiece or downwardly movable to a releasing position perpendicular to the bottom surface of the carrying board to release the workpiece; the wedge roller wedged in the roller groove of the rotating part to fix the arresting barrier at the suspending positions;

wherein the adjusting screw is movable related to the cylinder element to adjust the elasticity of the spring acted on the wedge roller;

wherein the blocking part at the releasing position is extended into the observing space and guides the workpiece.

2. The orientating and installing jig according to claim 1, wherein a quantity of the arrest-orientating module is one pair, and are oppositely disposed at two sides of the assembling opening.

3. The orientating and installing jig according to claim 2, wherein the hinge seat is screwed to a bottom surface of the carrying board by a screw, wherein each of the hinge seat has a pair of guiding portions formed at two sides thereof.

4. The orientating and installing jig according to claim 3, wherein the hinge seat has a receiving compartment formed in a bottom surface thereof, wherein the arresting barrier is received in the receiving compartment, wherein each of the arrest-orientating module further includes a bolt transversely passing through the hinge seat, the receiving compartment and the arresting barrier.

5. The orientating and installing jig according to claim 4, wherein the hinge seat includes a restrict protrusion protruded into the receiving compartment and aligned to a bottom surface of the hinge seat, wherein the restrict protrusion and an inner side of the receiving compartment define a rotation space, wherein a front end of the restrict protrusion is recessed away from an inner surface of the hinge seat by a predetermined distance.

6. The orientating and installing jig according to claim 5, wherein the rotating part is substantially shaped in a cylinder and arranged in the receiving compartment;
wherein the blocking part is plate-shaped and a thickness of the blocking part is substantially equal to the predetermined distance.

7. The orientating and installing jig according to claim 6, wherein the through hole is formed from an outer side of the hinge seat to the rotation space, wherein the position-latch module is installed in the through hole.

8. The orientating and installing jig according to claim 7, wherein the wedge roller is partially exposed outside one end of the cylinder element for abutting against the rotating part of the arresting barrier.

9. The orientating and installing jig according to claim 8, wherein the position-latch module further includes a remaining nut to screw the cylinder element in the hinge seat.

10. The orientating and installing jig according to claim 1, further comprising a plurality of fixing posts fixedly disposed on a bottom surface of the carrying board for uplifting and fixing the carrying board above the supporting baseplate, wherein each of the fixing posts has a fixing protrusion protruded from a bottom end thereof to be fixed on the supporting baseplate.

11. The orientating and installing jig according to claim 2, wherein the rotating part is substantially shaped in a cylinder and rotatably arranged on the hinge seat, the blocking part is plate-shaped and extended into the assembling opening.

12. The orientating and installing jig according to claim 11, wherein the hinge seat is formed concavely with a receiving compartment, wherein the through hole is formed through the hinge seat and communicated with the receiving compartment, wherein the position-latch module is received in the through hole of the hinge seat and extended into the receiving compartment.

13. The orientating and installing jig according to claim 12, wherein the wedge roller is partially exposed outside one end of the cylinder element for abutting against the rotating part of the arresting barrier, wherein the rotating part is formed with a roller groove, and the wedge roller abut against the roller groove of the rotating part.

14. The orientating and installing jig according to claim 13, wherein the position-latch module further includes a remaining nut for fixedly screwing the cylinder element to the hinge seat.

\* \* \* \* \*